(12) United States Patent
Lee et al.

(10) Patent No.: US 10,663,826 B2
(45) Date of Patent: May 26, 2020

(54) LIQUID CRYSTAL DISPLAY DEVICE

(71) Applicant: LG Display Co., Ltd., Seoul (KR)

(72) Inventors: Joun-Ho Lee, Daegu (KR); Sang-Soon Yoon, Paju-si (KR); Soo-In Jo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 17 days.

(21) Appl. No.: 15/975,517

(22) Filed: May 9, 2018

(65) Prior Publication Data

US 2018/0335678 A1    Nov. 22, 2018

(30) Foreign Application Priority Data

May 18, 2017  (KR) .................. 10-2017-0061552

(51) Int. Cl.
*G02F 1/1343* (2006.01)
*G02F 1/137* (2006.01)

(52) U.S. Cl.
CPC ........ *G02F 1/137* (2013.01); *G02F 1/134363* (2013.01); *G02F 2001/13706* (2013.01); *G02F 2001/13712* (2013.01); *G02F 2001/134372* (2013.01)

(58) Field of Classification Search
None
See application file for complete search history.

(56) References Cited

U.S. PATENT DOCUMENTS

2014/0092353 A1*  4/2014  Matsushima ..... G02F 1/133512
                                                                    349/110
2018/0081246 A1*  3/2018  Mimura ............ G02F 1/134363

\* cited by examiner

*Primary Examiner* — Phu Vu
(74) *Attorney, Agent, or Firm* — Polsinelli PC (57) ABSTRACT

A liquid crystal display device includes a first substrate; a plurality of gate lines and a plurality of data lines crossing each other to define a plurality of pixel regions on the first substrate; a thin film transistor electrically connected to each gate line and each data line; a first electrode having a plate shape, contacting a drain electrode of the thin film transistor and disposed in each pixel region; a passivation layer on the first electrodes; and a second electrode on the passivation layer, wherein the second electrode has an opening corresponding to the first electrode.

13 Claims, 9 Drawing Sheets

|  | Rising Time (%) | Falling Time (%) |
|---|---|---|
| Ref | 100 | 100 |
| Em2 | 65 | 46.5 |

FIG.8B

LIQUID CRYSTAL DISPLAY DEVICE

CROSS-REFERENCE TO RELATED APPLICATION

This application claims the benefit under 35 U.S.C. § 119(a) of Korean Patent Application No. 10-2017-0061552, filed on May 18, 2017, in the Korean Intellectual Property Office, which is incorporated herein by reference in its entirety.

BACKGROUND

Field of the Disclosure

The present disclosure relates to a liquid crystal display device, and more particularly, to a liquid crystal display device capable of effectively improving response speed and transmittance.

Description of the Background

In general, a liquid crystal display device (LCD) is driven by using optical anisotropy and polarization properties of liquid crystal. Since the liquid crystal has a long and thin structure, liquid crystal molecules have an alignment direction. The alignment direction of the liquid crystal molecules may be controlled by applying an electric field to the liquid crystal.

Therefore, when the alignment direction of the liquid crystal molecules is arbitrarily adjusted, an alignment of the liquid crystal molecules may be changed. Accordingly, light may be refracted in the alignment direction of the liquid crystal molecules due to the optical anisotropy to display image information.

Currently, an active matrix LCD (hereinafter, abbreviated as LCD), in which thin film transistors and pixel electrodes connected to the thin film transistors are arranged in a matrix form, has been attracting the most attention due to high resolution and superiority in displaying moving images.

The LCD includes a color filter substrate on which a common electrode is formed, an array substrate on which a pixel electrode is formed, and liquid crystal interposed between the two substrates. Since the liquid crystal is driven by an electric field induced between the common electrode and the pixel electrode, the LCD has excellent characteristics such as high transmittance and aperture ratio.

In addition, recently, an in-plane switching (IPS) mode LCD, in which electrodes have been alternately disposed on one substrate of upper and lower substrates and liquid crystal is disposed between the upper and lower substrates to display an image, has been developed.

Commonly, the IPS mode LCD displays an image by adjusting light transmittance of liquid crystal having dielectric anisotropy ($\Delta\varepsilon$) by using an electric field. The IPS mode LCD is mostly formed by attaching a color filter substrate on which a color filter is formed and an array substrate on which a thin film transistor is formed and interposing liquid crystal therebetween.

Here, the array substrate includes a thin film transistor, a pixel electrode, and a common electrode, which are formed in each pixel region defined on the array substrate by a crossing of a gate line and a data line.

The thin film transistor supplies a data signal from the data line to the pixel electrode in response to a gate signal from the gate line.

The pixel electrode receives the data signal from the thin film transistor to allow liquid crystal to be driven, and the common electrode receives a common voltage which is a reference when the liquid crystal is driven. The liquid crystal is rotated according to an electric field generated by the data signal of the pixel electrode and the common voltage of the common electrode, so that light transmittance is adjusted to implement gray scales.

Recently, a fringe field switching (FFS) mode LCD having a better viewing angle characteristic than that of the IPS mode LCD has been proposed.

Figure 1:
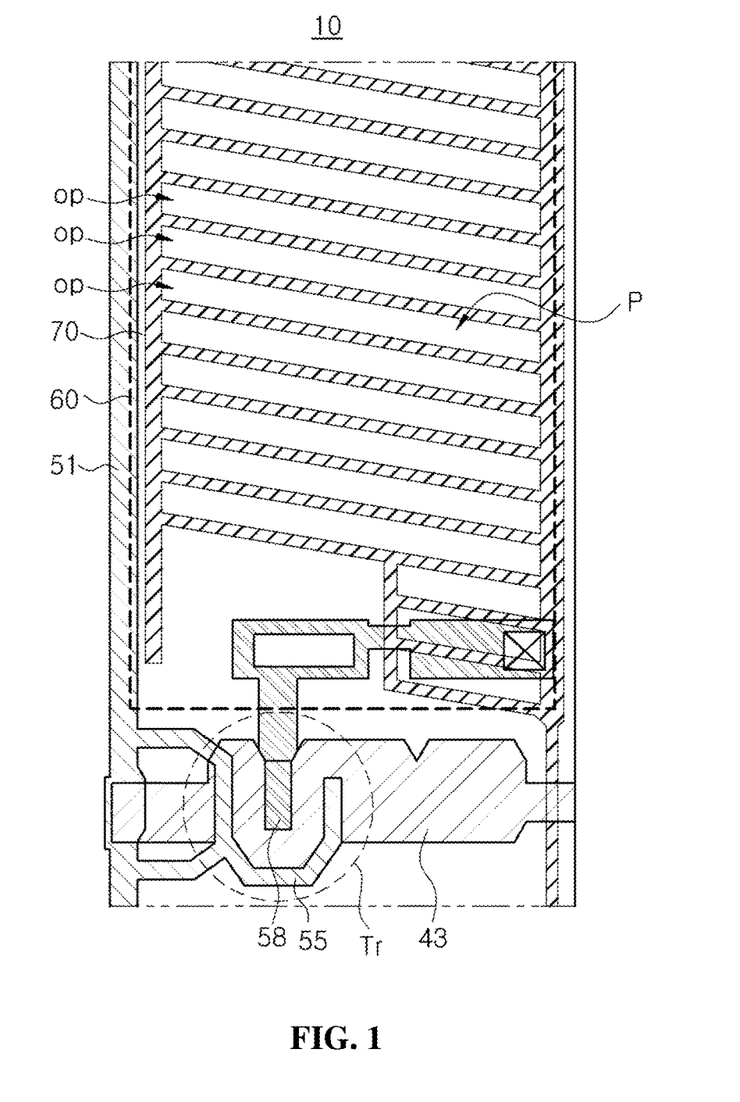
FIG. 1 is a schematic view showing the related art fringe field switching (FFS) mode liquid crystal display device (LCD)

FIG. 1 is a schematic view showing the related art FFS mode LCD.

As shown in FIG. 1, the FFS mode LCD 10 includes a gate line 43 having a linear shape in one direction and a data line 51 having a linear shape crossing the gate line 43 to define a pixel region P.

In addition, a switching element, i.e., a thin film transistor Tr is formed in the pixel region P. The thin film transistor Tr is connected to the data line 51 and the gate line 43 and includes a gate electrode (not shown), a gate insulating layer (not shown), a semiconductor layer (not shown), and source and drain electrodes 55 and 58.

A plate-shaped common electrode 60 and a pixel electrode 70 overlapping the plate-shaped common electrode 60 are formed in the pixel region P. The pixel electrode 70 has a plurality of bar-shaped openings.

In this case, the plate-shaped common electrode 60 is formed on the entire surface of a display region, but a portion of the plate-shaped common electrode 60 corresponding to one pixel region P is indicated by a dotted line.

The FFS mode LCD 10 having such a configuration generates a fringe field by applying a voltage to the plate-shaped common electrode 60 and the pixel electrode 70 having the plurality of bar-shaped openings in each pixel region P.

Meanwhile, recently, in order to enhance the realism of a display, high response speed of an LCD has been actively researched.

Here, the response speed (hereinafter, referred to as GTG (grey to grey)) indicates the time it takes to go from a light gray color to a dark gray color. That is, the response speed is a value obtained by measuring a time for brightness to be changed from 10% to 90%.

For example, in the case of a virtual reality (VR) device, since an image is viewed in a state in which eyes are close to a screen, high response speed of an LCD becomes very important.

However, since the FFS mode LCD 10 uses an electro-optical effect of a fluid, i.e., liquid crystal, response speed is limited due to behavior of the liquid crystal. Therefore, an afterimage due to flickering can occur. In the case of the related art FFS mode LCD 10, a viewing angle characteristic is improved, but there is a limit in improvement of response speed.

SUMMARY

Accordingly, the present disclosure is directed to a liquid crystal display device that substantially obviates one or more of the problems due to limitations and disadvantages of the related art.

More specifically, the present disclosure is to provide a liquid crystal display device capable of effectively implementing high response speed and improving transmittance at the same time.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages, the present disclosure provides a liquid crystal display device includes a first substrate; a plurality of gate lines and a plurality of data lines crossing each other to define a plurality of pixel regions on the first substrate; a thin film transistor electrically connected to each gate line and each data line; a first electrode having a plate shape, contacting a drain electrode of the thin film transistor and disposed in each pixel region; a passivation layer on the first electrode; and a second electrode on the passivation layer, wherein the second electrode has an opening corresponding to the first electrode.

In another aspect of the present disclosure, a liquid crystal display device includes a first substrate; a plurality of gate lines and a plurality of data lines crossing each other and defining a plurality of pixel regions on the first substrate; a thin film transistor electrically connected to each gate line and each data line; a common electrode disposed in each pixel region and having a plate shape; a passivation layer on the first electrode; and a pixel electrode on the passivation layer and having first and second openings facing the first electrode.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide further understanding of the disclosure, are incorporated in and constitute a part of this application, illustrate implementations of the disclosure and together with the description serve to explain the principles of the aspects of the disclosure.

In the drawings.

DETAILED DESCRIPTION

Hereinafter, an LCD according to exemplary aspects of the present disclosure will be described with reference to the accompanying drawings. Wherever possible, the same reference numbers will be used throughout the drawings to refer to the same or like parts.

Figure 2:
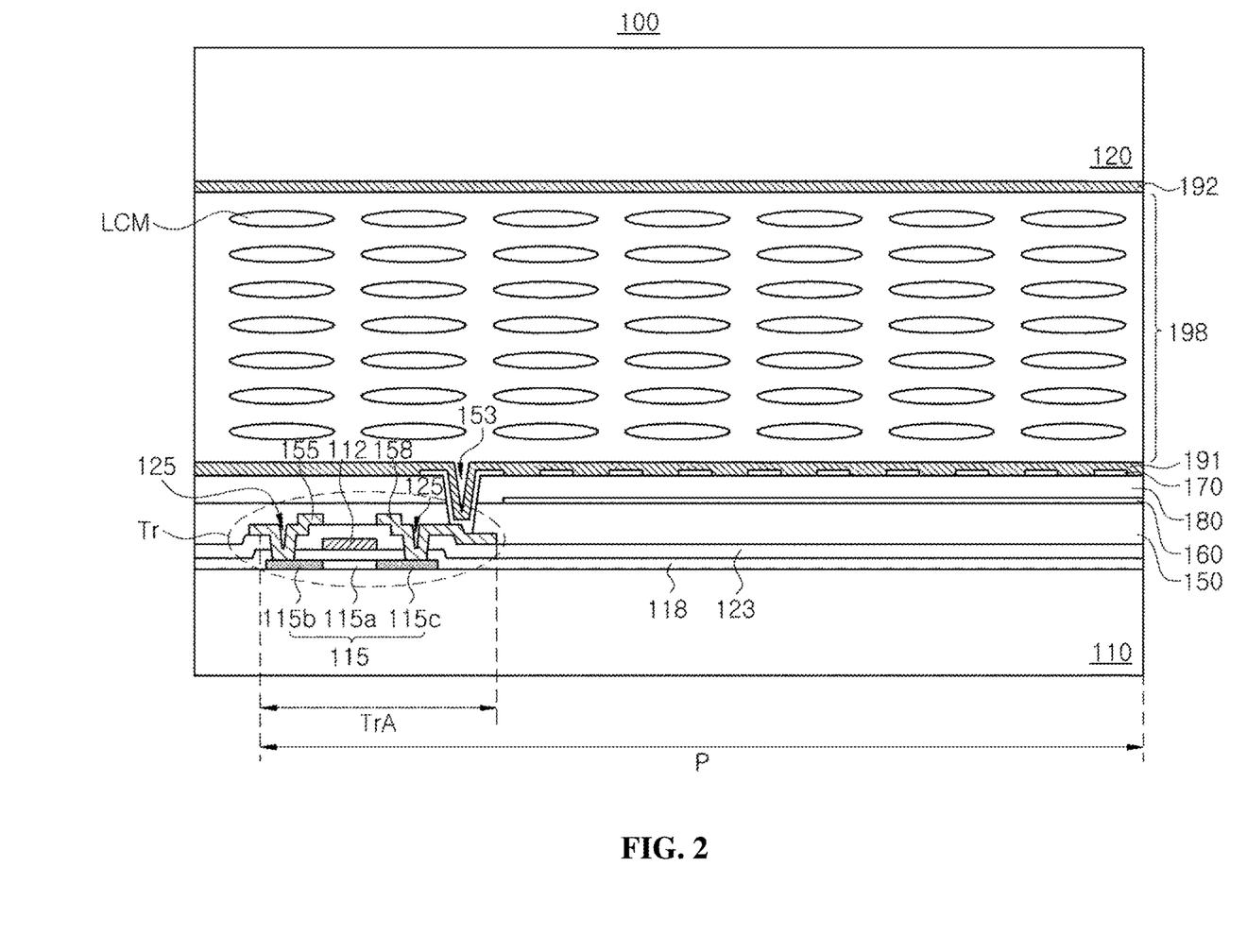
FIG. 2 is a schematic view showing a configuration of an LCD according to an aspect of the present disclosure.

FIG. 2 is a schematic view showing a configuration of a liquid crystal display device (LCD) according to an aspect of the present disclosure.

As shown in FIG. 2, a semiconductor layer 115 may be formed in an element region TrA in each pixel region P on a first substrate 110 in which a thin film transistor Tr is formed. A gate insulating layer 118 may be formed on the semiconductor layer 115 and the entire surface of the first substrate 10. A gate electrode 112 may be formed on the gate insulating layer 118 so as to correspond to a central portion of the semiconductor layer 115.

In addition, an interlayer insulating film 123 having semiconductor contact holes 125 may be formed on the gate electrode 112 and the entire surface of the first substrate 110. The semiconductor contact holes 125 respectively expose highly doped source and drain regions 115b and 115c of the semiconductor layer 115 which are exposed to the outside of the gate electrode 112.

In the foregoing description, the thin film transistor Tr having a coplanar structure has been described as an example, but the present disclosure is not limited thereto. For example, a thin film transistor having a bottom gate structure may be used.

Source and drain electrodes 155 and 158 may be formed on the interlayer insulating film 123 so as to respectively be in contact with the source region 115b and the drain region 115c through the semiconductor contact holes 125 and be spaced apart from each other.

First and second passivation layers 150 and 180 having a drain contact hole 153 configured to expose the drain electrode 158 may be formed on the source and drain electrodes 155 and 158.

Here, a common electrode 160 may be disposed between the first passivation layer 150 and the second passivation layer 180, and a pixel electrode 170 may be disposed on the second passivation layer 180.

Here, the pixel electrode 170 may be in contact with the drain electrode 158 through the drain contact hole 153.

On the other hand, a first alignment layer 191 may be formed on the pixel electrode 170.

As described above, since the second passivation layer 180 is formed between the common electrode 160 and the pixel electrode 170, it is possible to implement a structure in which a fringe field is generated when a voltage is applied.

On the other hand, a black matrix (not shown) configured to prevent light leakage may be formed on an inner surface of a second substrate 120 opposite to the first substrate 110. A color filter layer (not shown) having red, green, and blue color filter patterns may be formed between the black matrixes.

An overcoat layer (not shown) configured to flatten a surface of the color filter layer and protect the color filter layer may be formed on the color filter layers. A second alignment layer 192 may be formed on the overcoat layer.

As described above, a fringe field switching (FFS) mode LCD 100 is manufactured by attaching the first substrate 110 and the second substrate 120 and interposing a liquid crystal layer 198 which has liquid crystal molecules LCM therebetween.

The above-described configuration of the FFS mode LCD 100 is merely an example, and the present disclosure is not limited thereto.

Figure 3:
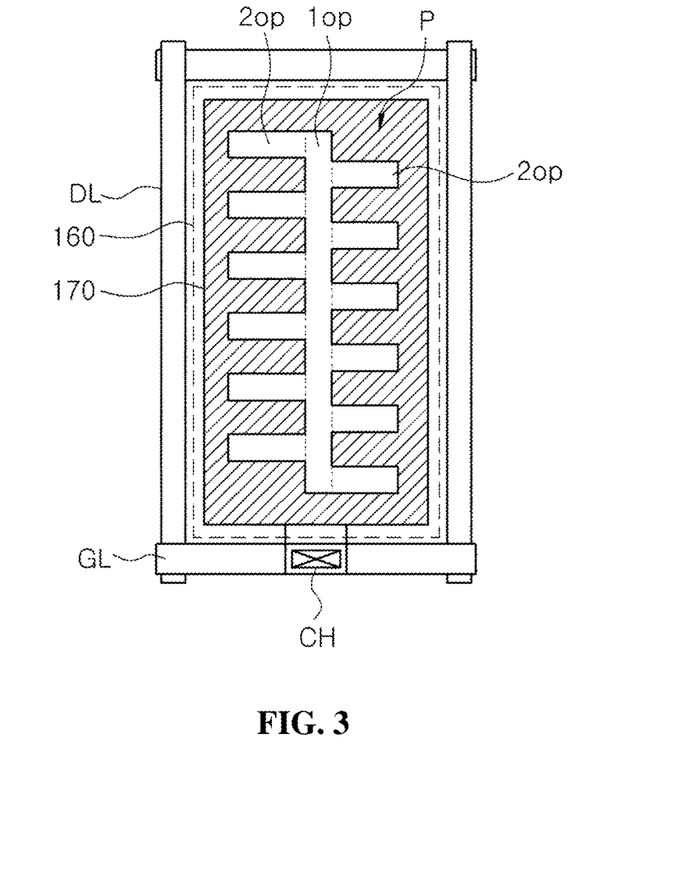
FIG. 3 is a plan view showing a portion of an array substrate according to an aspect of the present disclosure.

FIG. 3 is a plan view showing a portion of an array substrate according to an aspect of the present disclosure.

FIG. 3 shows the thin film transistor Tr of FIG. 2 configured to switch a voltage on/off at a crossing of a gate line GL and a data line DL crossing each other to define the pixel region P, the common electrode 160 having a plate shape and formed in the pixel region P, and the pixel electrode 170 having a plurality of openings.

Here, the common electrode 160 is formed on the entire surface of a display region, but a portion of the common electrode 160 corresponding to one pixel region P is indicated by a dotted line. The pixel electrode 170 is disposed over the common electrode 160. The pixel electrode 170 may be connected to the thin film transistor Tr of FIG. 2 through a contact hole CH.

Here, the pixel electrode 170 may have a first opening 1*op* extending in a direction parallel to the data line DL at a central portion thereof.

In addition, the pixel electrode 170 may have second openings 2*op* extending in a direction parallel to the gate line GL with respect to the first opening 1*op*.

Here, the first opening 1*op* and the second openings 2*op* may have a rectangular shape.

A plurality of second openings 2*op* may be disposed so as to be spaced apart from each other.

Here, the second openings 2*op* may be mutually asymmetrical with respect to the first opening 1*op*. That is, the pixel electrode 170 allows bar-shaped electrodes to be formed through the second openings 2*op*. Therefore, the pixel electrode 170 may have a shape in which the second openings 2 and the bar-shaped electrodes are alternately formed.

In this case, the FFS mode LCD 100 according to an aspect forms an asymmetric structure with respect to the first opening 1*op*.

That is, when the second openings 2*op* are disposed at a left side of the first opening 1*op*, the bar-shaped electrodes may be disposed at a right side of the first opening 1*op*. When the second openings 2*op* are disposed at the right side of the first opening 1*op*, the bar-shaped electrodes may be disposed at the left side of the first opening 1*op*. Accordingly, the FFS mode LCD 100 may have an electrode structure in which a right side and a left side are mutually asymmetrical with respect to the first opening 1*op*.

Since a region in which the liquid crystal molecules LCM of FIG. 2 are rotated in the same direction is made smaller due to the structure of the pixel electrode 170, an elastic force is increased between the liquid crystal molecules LCM, thereby increasing response speed of an LCD.

As described above, the response speed of the LCD 100 can be considered to be improved as compared to that of the related art FFS mode LCD 10 of FIG. 1.

Since disclination occurs at a boundary between the liquid crystal molecules LCM in a case in which the rotation directions of the liquid crystal molecules LCM are different, in the electrode structure of the FFS mode LCD 100 according to an aspect, the liquid crystal molecules LCM are rotated in different directions when a voltage is applied.

Thus, a plurality of disclination lines can occur and sufficient transmittance may not be obtained.

Another aspect of the present disclosure relates to an LCD capable of implementing high response speed and improving transmittance at the same time. Hereinafter, another aspect of the present disclosure will be described with reference to drawings.

Figure 4:
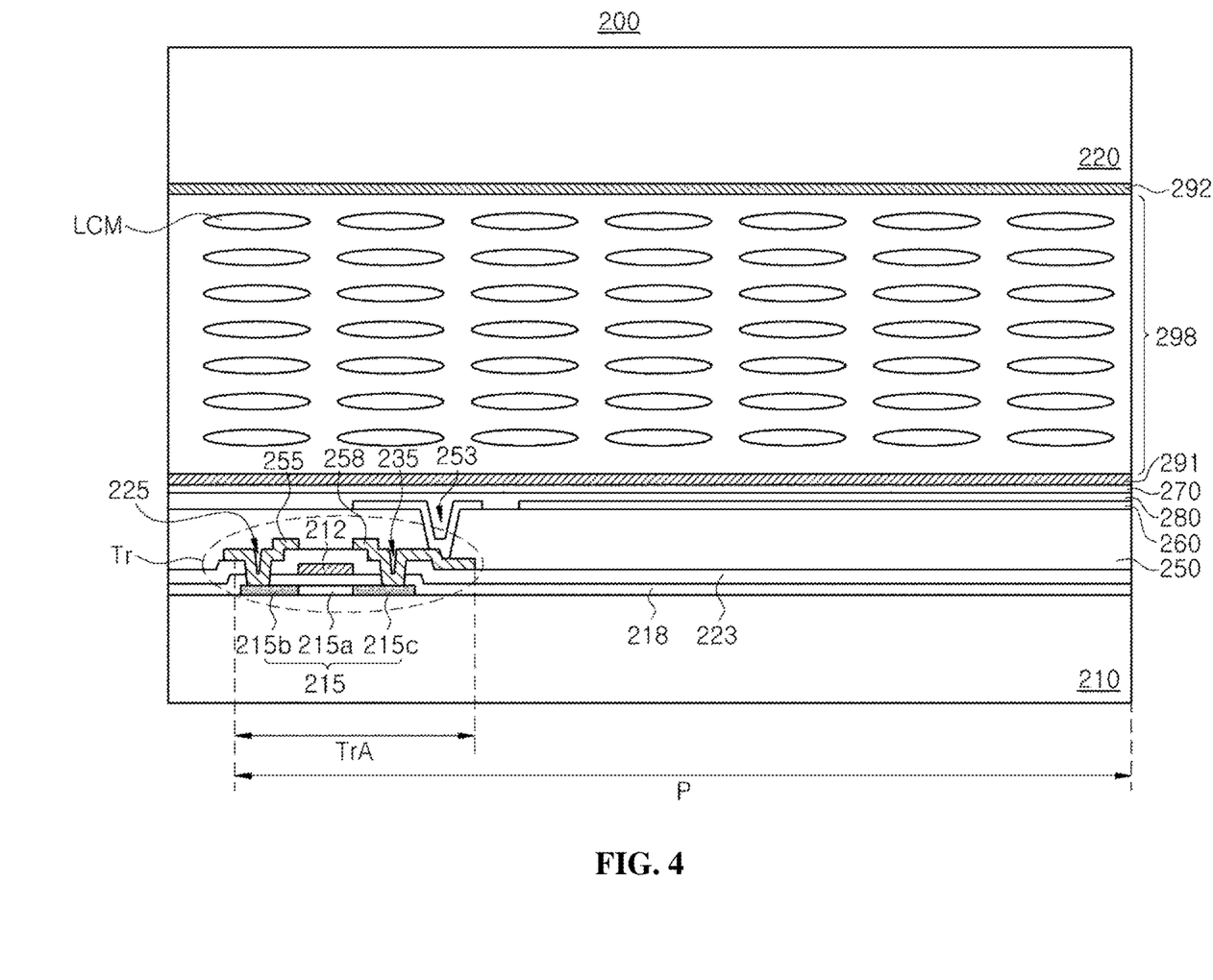
FIG. 4 is a schematic view showing a configuration of an LCD according to another aspect of the present disclosure.
Figure 5:
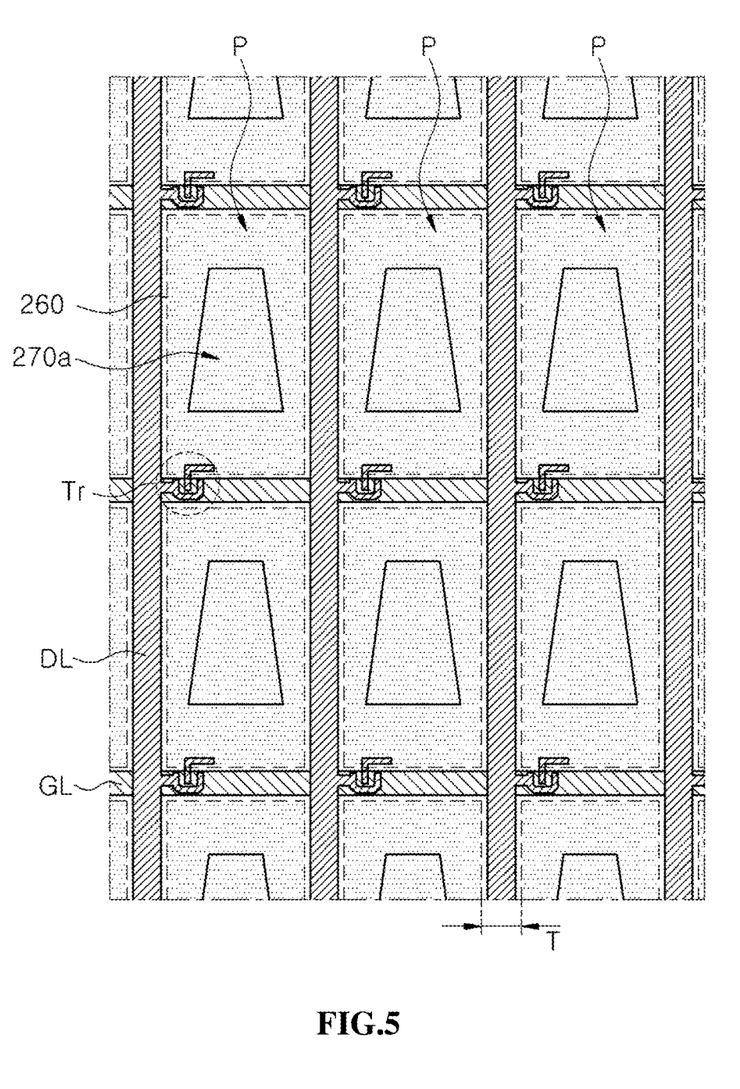
FIG. 5 is a plan view showing a portion of an array substrate according to another aspect of the present disclosure.

FIG. 4 is a schematic view showing a configuration of the LCD according to another aspect of the present disclosure, and FIG. 5 is a plan view showing a portion of an array substrate according to another aspect of the present disclosure.

As shown in FIG. 4, a semiconductor layer 215 may be formed in an element region TrA in each pixel region P on a first substrate 210 in which a thin film transistor Tr is formed. A gate insulating layer 218 may be formed on the semiconductor layer 215 and the entire surface of the first substrate 210. A gate electrode 212 may be formed on the gate insulating layer 218 so as to correspond to a central portion of the semiconductor layer 215.

In addition, an interlayer insulating film 223 having semiconductor contact holes 225 may be formed on the gate electrode 212 and the entire surface of the first substrate 210. The semiconductor contact holes 225 respectively expose highly doped source and drain regions 215*b* and 215*c* of the semiconductor layer 215 which are exposed to the outside of the gate electrode 212.

In the foregoing description, the thin film transistor Tr having a co-planar structure has been described as an example, but the present disclosure is not limited thereto. For example, a thin film transistor having a bottom gate structure may be used.

In addition, source and drain electrodes 255 and 258 may be formed on the interlayer insulating film 223 so as to respectively be in contact with the source region 215*b* and the drain region 215*c* through the semiconductor contact holes 225 and be spaced apart from each other.

A first passivation layer 250 having a drain contact hole 253 configured to expose the drain electrode 258 may be formed on the source and drain electrodes 255 and 258.

Here, in an LCD 200 according to another aspect of the present disclosure, a first electrode 260 having a plate shape is disposed on the first passivation layer 250 and is made of a transparent conductive material such as indium-tin-oxide (ITO) and indium-zinc-oxide (IZO).

The first electrode 260 is in contact with the drain electrode 258 through the drain contact hole 253 formed in the first passivation layer 250.

That is, the first electrode 260 may be formed in each pixel region P, and each first electrode 260 may be connected to each thin film transistor Tr through the drain contact hole 253.

A second passivation layer 280 may be formed on the first electrode 260 and the entire surface of a display region and may be made of an inorganic insulating material such as silicon oxide ($SiO_2$) and silicon nitride (SiNx), or an organic insulating material such as benzocyclobutene (BCB) or photo acryl.

In addition, a second electrode 270 is formed on the second passivation layer 280 in the entire region of the display region and is made of a transparent conductive material such as indium-tin-oxide (ITO) and indium-zinc-oxide (IZO).

Here, the second electrode 270 may have an opening corresponding to the first electrode 260 formed in each pixel region P. The opening formed in the second electrode 270 will be described in more detail below.

Meanwhile, a first alignment layer 291 may be formed on the second electrode 270.

As described above, since the second passivation layer 280 is formed between the first electrode 260 and the second electrode 270, it is possible to implement a structure in which a fringe field is generated when a voltage is applied.

On the other hand, a black matrix (not shown) configured to prevent light leakage may be formed on an inner surface of a second substrate 220 opposite to the first substrate 210. A color filter layers (not shown) having red, green, and blue color filter patterns may be formed between the black matrixes.

An overcoat layer (not shown) configured to flatten a surface of the color filter layers and protect the color filter layers may be formed on the color filter layers. A second alignment layer 292 may be formed on the overcoat layer.

As described above, the FFS mode LCD 200 is manufactured by attaching the first substrate 210 and the second substrate 220 and interposing a liquid crystal layer 298 having liquid crystal molecules LCM therebetween.

In the LCD 200 according to an aspect of the present disclosure, the drain electrode 258 and the first electrode 260 are in contact with each other through the drain contact hole 253. However, in another aspect, the drain electrode 258 and the second electrode 270 may be in contact with each other through the drain contact hole 253, the first electrode 260 may be formed on the entire surface of the display region, and the second electrode 270 may be formed for each pixel region P.

In addition, one electrode of the first electrode 260 and the second electrode 270 may be a pixel electrode, and the other electrode may be a common electrode.

The above-described configuration of the FFS mode LCD 200 is merely an example, and the present disclosure is not limited thereto.

Hereinafter, a case in which the first electrode 260 is a pixel electrode and the second electrode 270 is a common electrode will be described as an example.

FIG. 5 shows a gate line GL and a data line DL crossing each other to define the pixel region P in which the thin film transistor Tr is configured to switch a voltage on/off at a crossing of the gate line GL and the data line DL, the pixel electrode 260 has a plate shape and is formed in each pixel region P, and the common electrode 270 of FIG. 4 has openings 270a.

Here, the common electrode 270 of FIG. 4 is formed on the entire surface of the display region. The openings 270a of the common electrode 270 are indicated by a solid line, and the pixel electrode 260 formed in each pixel region P is indicated by a dotted line.

The pixel electrode 260 is connected to the thin film transistor Tr through the drain contact hole 253 of FIG. 4.

The thin film transistor Tr is shown as an example in the drawing as having a U-shaped channel. However, a channel shape of the thin film transistor Tr may be variously modified according to structures of the source and drain electrodes 255 and 258 of FIG. 4.

In addition, the gate electrode 212 of FIG. 4 of the thin film transistor Tr is shown as being formed as a portion of the gate line GL itself. However, the gate electrode 212 of FIG. 4 may be formed so as to be branched into the pixel region P from the gate line GL.

Here, in the LCD 200 of FIG. 4 according to another aspect of the present disclosure, the opening 270a of the common electrode 270 of FIG. 4 is formed so as to correspond to the pixel electrode 260 formed in each pixel region P.

That is, one opening 270a of the common electrode 270 of FIG. 4 may be formed in one pixel region P, and the opening 270a may have a trapezoidal shape.

Figure 6A:
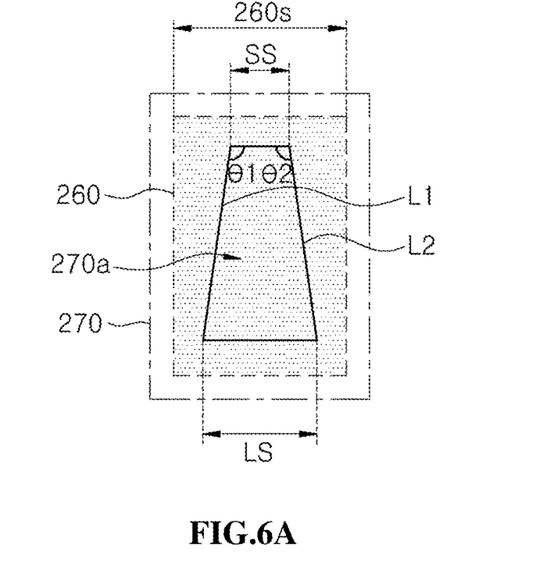
FIG. 6A is a plan view showing one pixel region of the array substrate according to another aspect of the present disclosure.
Figure 6B:
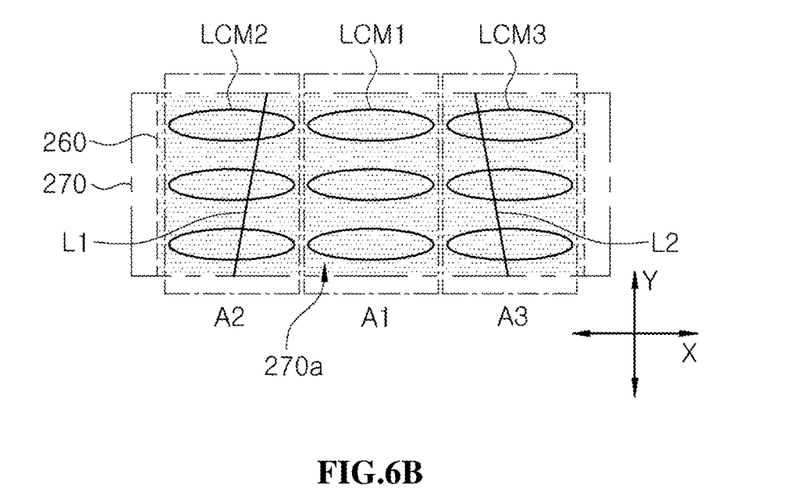
FIG. 6B is a schematic view showing an initial alignment state of liquid crystal molecules of the LCD according to another aspect of the present disclosure.
Figure 6C:
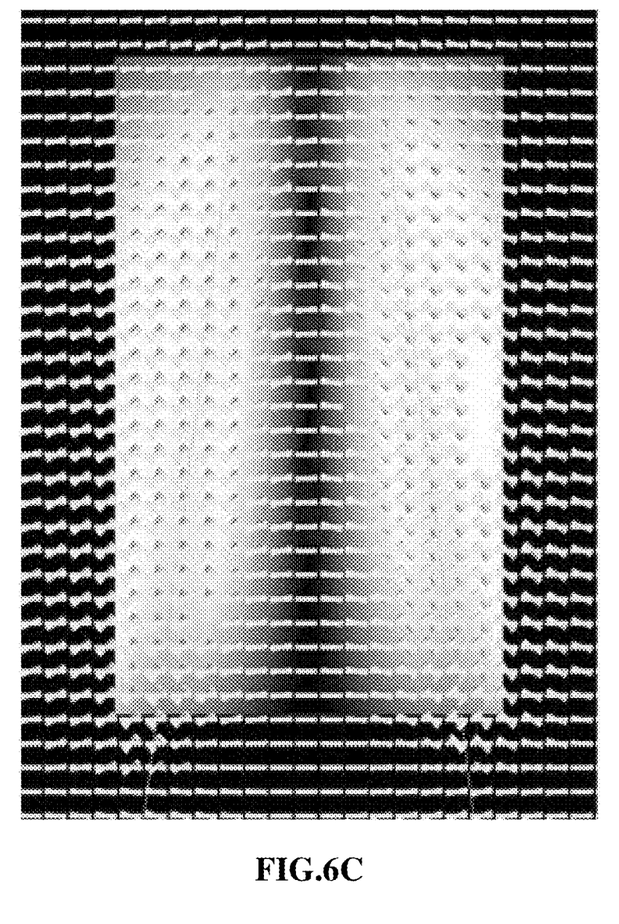
FIG. 6C is a schematic image showing a motion of the liquid crystal molecules according to another aspect of the present disclosure.

FIG. 6A is a plan view showing one pixel region of the array substrate according to another aspect of the present disclosure. FIG. 6B is a schematic view showing an initial alignment state of the liquid crystal molecules LCM of the LCD 200 according to another aspect of the present disclosure. FIG. 6C is a schematic image showing a motion of the liquid crystal molecules LCM according to another aspect of the present disclosure.

As shown in FIG. 6A, the common electrode 270 is disposed on the pixel electrode 260, and the common electrode 270 includes the opening 270a having a trapezoidal shape. Here, the common electrode 270 corresponding to one pixel region P is indicated by a dash-dotted line, the opening 270a of the common electrode 270 is indicated by a solid line, and the pixel electrode 260 is indicated by a dotted line.

Here, the opening 270a having the trapezoidal shape may have a short side SS and a long side LS, which are parallel to the gate line GL of FIG. 5.

In addition, the opening 270a may have first and second sides L1 and L2 connecting the short side SS and the long side LS.

The opening 270a having the trapezoidal shape may have bilateral symmetry.

Here, a length of the short side SS of the opening 270a may be 0.15 times to 0.3 times a width 260s of the pixel electrode 260 formed in one pixel region P.

Here, the width 260s of the pixel electrode 260 means a width along a minor axis of the pixel electrode 260, which is parallel to the gate line GL of FIG. 5.

Here, a length of the long side LS of the opening 270a may be 0.7 times to 0.8 times the width 260s of the pixel electrode 260.

The short side SS of the opening 270a having the trapezoidal shape and the first side L1 or the second side L2 may form first and second obtuse angles θ1 and θ2 which are equal to each other. The first and second obtuse angles θ1 and θ2 may be in a range of 91° to 130°.

Here, the width 260s of the pixel electrode 260 may be in a range of 5 μm to 6 μm, but is not limited thereto.

A distance T of FIG. 5 between adjacent pixel electrodes 260 in an extension direction of the gate line L of FIG. 5 may be in a range of 2 μm to 4 μm, but is not limited thereto.

A desired gray scale can be expressed even by fine rotation of the liquid crystal molecules LCM of FIG. 4 by the pixel electrode 260 and the opening 270a of the common electrode 270 disposed over the pixel electrode 260. That is, a rising time of the liquid crystal can be reduced.

FIG. 6B shows the initial alignment state of the liquid crystal molecules LCM of the LCD 200 according to the second aspect.

Here, FIG. 6B shows first liquid crystal molecules LCM1 disposed on a first region A1, i.e., a region of the opening 270a of the common electrode 270, and second and third liquid crystal molecules LCM2 and LCM3 disposed on second and third regions A2 and A3, i.e., regions of the first and second sides L1 and L2 of the opening 270a of the common electrode 270.

That is, the first liquid crystal molecules LCM1 may be liquid crystal molecules disposed in a region in which the common electrode 270 and the pixel electrode 260 do not overlap each other.

Here, the first to third liquid crystal molecules LCM1 to LCM3 may be positive liquid crystal molecules having positive dielectric anisotropy (Δε). In this case, an alignment direction may be a direction parallel to a second axis Y.

In addition, the first to third liquid crystal molecules LCM1 to LCM3 may be negative liquid crystal molecules having negative dielectric anisotropy (Δε). In this case, an alignment direction may be a direction parallel to a first axis X which is perpendicular to the second axis Y.

Hereinafter, a case in which the first to third liquid crystal molecules LCM1 to LCM3 are the negative liquid crystal molecules having the negative dielectric anisotropy (Δε) will be described as an example.

Here, the first alignment layer 291 of FIG. 4 of the first substrate 210 of FIG. 4 and the second alignment layer 292 of FIG. 4 of the second substrate 220 in FIG. 4 may have the same alignment direction.

Here, an initial alignment direction of the first to third liquid crystal molecules LCM1 to LCM3 is the same direction as the first axis X.

FIG. 6C shows a motion of the first to third liquid crystal molecules LCM1 to LCM3 when a voltage is applied to the pixel electrode 260 of FIG. 4 and the common electrode 270 of FIG. 4.

Here, referring to FIG. 6B, when a voltage is applied to the pixel electrode 260 of FIG. 4 and the common electrode 270 of FIG. 4, alignment directions of the first to third liquid crystal molecules LCM1 to LCM3 are changed according to an electric field formed between the pixel electrode 260 of FIG. 4 and the common electrode 270 of FIG. 4.

The first to third negative liquid crystal molecules LCM1 to LCM3 having negative dielectric anisotropy (Δε) are aligned such that a major axis thereof is parallel to a direction perpendicular to a direction in which an electric field is applied.

In this case, the first liquid crystal molecules LCM1 disposed on the first region A1, i.e., the region of the opening 270a of the common electrode 270, are not rotated due to electric fields in different directions being balanced.

That is, a major axis of the second and third liquid crystal molecules LCM2 and LCM3 disposed on the second and third regions A2 and A3 is rotated perpendicular to a direction in which an electric field is applied, but the first liquid crystal molecules LCM1 disposed on the first region A1 are not rotated.

That is, rotation regions, i.e., the second and third regions A2 and A3, are oriented to be mutually symmetrical with respect to a fixed region, i.e., the first region A1.

When a voltage is applied, only the second and third liquid crystal molecules LCM2 and LCM3 on the second and third regions A2 and A3, which are mutually symmetric with respect to the first liquid crystal molecules LCM1 on the first region A1, are rotated. Thus, when the applied voltage is removed, it is possible to increase a restoring force by which the second and third liquid crystal molecules LCM2 and LCM3 on the second and third regions A2 and A3 are returned to an initial alignment state by the first liquid crystal molecules LCM1 on the first region A1, thereby reducing a falling time.

Furthermore, since the second and third liquid crystal molecules LCM2 and LCM3 on the second and third regions A2 and A3 of another aspect of the present disclosure have the same rotation direction, it is possible to reduce the occurrence of disclination lines at boundaries between the liquid crystal molecules LCM in a case in which the rotation directions of the liquid crystal molecules LCM are different from that of an aspect, thereby effectively improving transmittance.

Figure 7A:
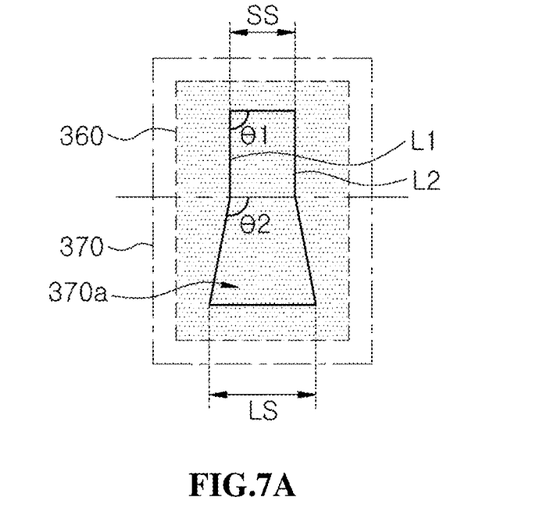
FIGS. 7A and 7B are schematic views showing modified examples of the LCD according to another aspect of the present disclosure.
Figure 7B:
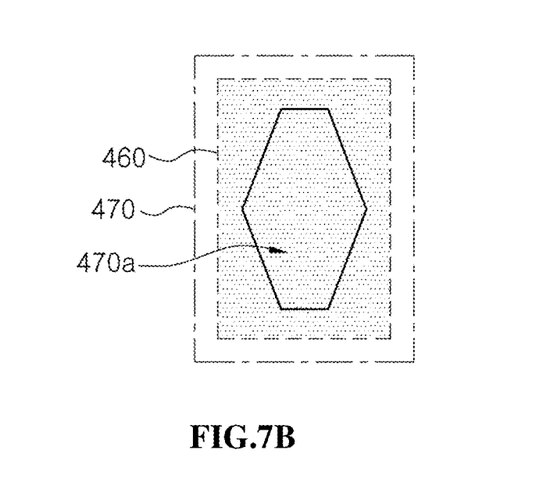

FIGS. 7A and 7B are schematic views showing modified examples of the LCD 200 according to another aspect of the present disclosure.

As shown in FIG. 7A, a common electrode 370 is disposed over a pixel electrode 360. The common electrode 370 has an opening 370a corresponding to the pixel electrode 360 formed in one pixel region P of FIG. 5.

Here, the opening 370a may have a short side SS and a long side LS, which are parallel to the gate line GL of FIG. 5.

In addition, the opening 270a may have first and second sides L1 and L2 connecting the short side SS and the long side LS.

Here, each of the first and second sides L1 and L2 may have two sides having different obtuse angles θ1 and θ2.

In addition, as shown in FIG. 7B, a common electrode 470 is disposed over a pixel electrode 460. The common electrode 470 may have an opening 470a having a hexagonal shape and corresponding to the pixel electrode 460 formed in one pixel region P of FIG. 5.

The modified example is merely an example, and the opening 470a of the common electrode 470 may have various shapes such as a polygonal shape having bilateral symmetry.

Figure 8A:
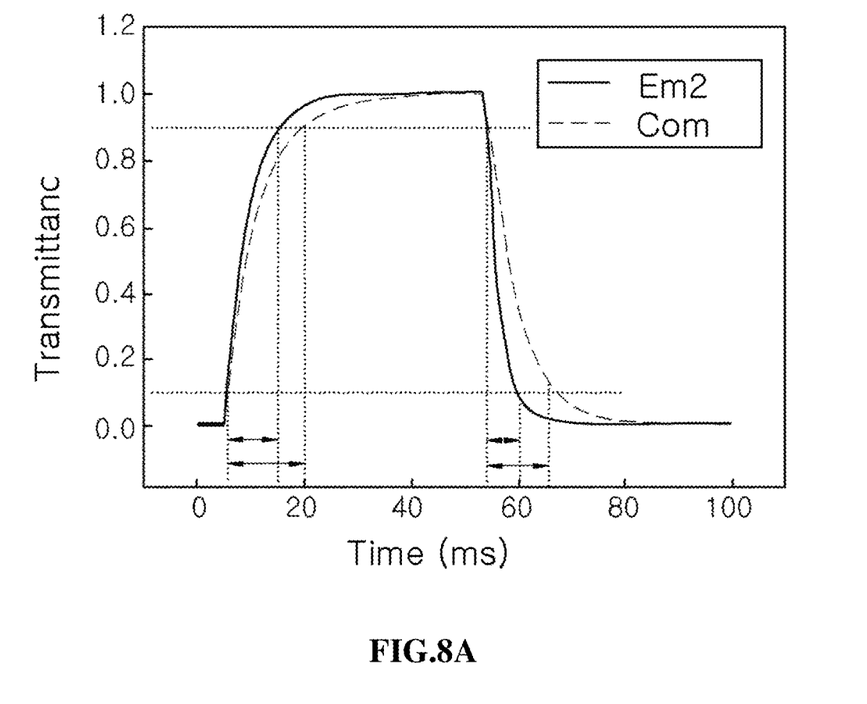
FIG. 8A is a graph showing a comparison between a change in transmittance of the LCD according to another aspect of the present disclosure and a change in transmittance of the related art LCD.
Figure 8B:
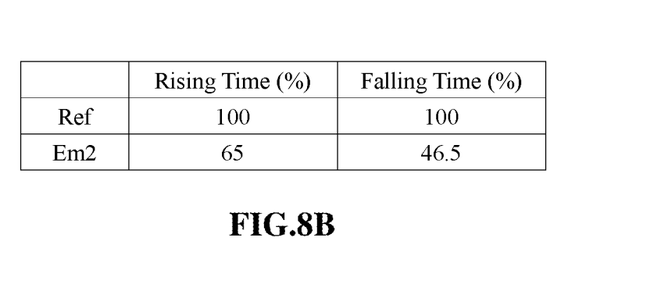
FIG. 8B is a graph showing a comparison between response speed of the LCD according to another aspect of the present disclosure and response speed of the related art LCD.

FIG. 8A is a graph showing a comparison between a change in transmittance of the LCD according to another aspect of the present disclosure and a change in transmittance of the related art LCD. FIG. 8B is a graph showing a comparison between response speed of the LCD according to another aspect of the present disclosure and response speed of the related LCD.

As shown in FIGS. 8A and 8B, a change in transmittance of the LCD 200 of FIG. 4 according to another aspect of the present disclosure Em2 can be considered to be faster than that of a comparative example Com, i.e., the related art LCD 10 of FIG. 1.

Here, response speed of an LCD in a normally black mode is determined as a rising time Ton, i.e., a time for transmittance to be changed from 10% to 90% due to alignment of liquid crystal molecules being changed when a potential difference is applied to a liquid crystal cell. On the contrary, the response speed of the LCD in the normally black mode is determined as a falling time Toff, i.e., a time for transmittance to be changed from 90% to 10% due to the alignment of the liquid crystal molecules being reversed when the potential difference is removed.

Referring to FIG. 8A, the rising time Ton is a time for transmittance on a Y-axis of the graph to be changed from 0.1 to 0.9. The falling time Toff is a time for the transmittance to be changed from 0.9 to 0.1.

Here, in comparison with the related art LCD 10 of FIG. 1, the transmittance of the LCD 200 of FIG. 4 according to another aspect of the present disclosure can be considered to rapidly rise when a voltage is applied and rapidly fall when the applied voltage is removed.

More specifically, referring to FIG. 8B, a rising time of the LCD 200 of FIG. 4 according to another aspect of the present disclosure is 65% of a rising time (Ref: 100%) of the related art LCD 10 of FIG. 1, and thus the rising time of the LCD 200 can be considered to be improved by 35% compared to the related art LCD 10 of FIG. 1. A falling time of the LCD 200 is 46.5% of a falling time (Ref: 100%) of the related art LCD 10 of FIG. 1, and thus the falling time of the LCD 200 can be considered to be improved by 53.5% compared to the related art LCD 10 of FIG. 1.

That is, the rising time Ton and the falling time Toff of the LCD 200 of FIG. 4 of another aspect of the present disclosure are significantly improved compared to those of the related art LCD 10 of FIG. 1.

As described above, in the LCD 200 according to another aspect of the present disclosure, a desired gray scale can be expressed by fine rotation of liquid crystal molecules through a pixel electrode and an opening of a common electrode disposed over the pixel electrode. That is, a rising time of the liquid crystal can be reduced.

In addition, when a voltage is applied, only second and third liquid crystal molecules on second and third regions, which are mutually symmetric with respect to first liquid crystal molecules on a first region, are rotated. Thus, when the applied voltage is removed, it is possible to increase a restoring force by which the second and third liquid crystal molecules on the second and third regions are returned to an initial alignment state by the first liquid crystal molecules on the first region, thereby reducing a falling time.

Furthermore, disclination lines can be reduced, thereby effectively improving transmittance when compared to an aspect of the present disclosure shown in FIG. 3.

As described above, the LCD according to the present disclosure can implement a display capable of performing a high speed response operation by simultaneously and effectively improving response speed and transmittance in comparison to the related art FFS mode LCD 10 of FIG. 1. For example, afterimages can be effectively remedied in a virtual reality (VR) device, and image quality can be improved at the same time.

In the present disclosure, a second electrode disposed over a first electrode formed in each pixel region has an opening corresponding to the first electrode to improve a rising time and a falling time of liquid crystal, thereby implementing a high speed response and effectively improving transmittance at the same time.

Although exemplary aspects of the present disclosure have been referenced and described above, it will be understood that it is possible for those of ordinary skill in the art to implement modifications and variations on the present disclosure without departing from the concept and scope of the present disclosure listed in the following appended claims.

What is claimed is:

1. A liquid crystal display device comprising:
   a first substrate;
   a plurality of gate lines and a plurality of data lines crossing each other and defining a plurality of pixel regions on the first substrate;
   a thin film transistor electrically connected to each gate line and each data line;
   a pixel electrode disposed in each pixel region, having a plate shape, and contacting a drain electrode of the thin film transistor;
   a passivation layer on the pixel electrode; and
   a common electrode on the passivation layer and having a single closed opening corresponding to one unit pixel region,
   wherein the single closed opening has two short sides parallel to the plurality of gate lines and two long sides extended along the plurality of data lines, and the two long sides has a length substantially longer than the two short sides to provide first, second and third rotation regions for a plurality of liquid crystal molecules in the one unit pixel region when an electric filed is applied, and
   wherein the first rotation region is disposed between the second and third rotation regions and the plurality of liquid crystal molecules disposed in the second and third rotation regions is rotated perpendicular or parallel to a direction in which the electric field is applied and the plurality of liquid crystal molecules disposed in the first rotation region is not rotated when the electric filed is applied.

2. The liquid crystal display device of claim 1, wherein the single closed opening has a trapezoidal shape.

3. The liquid crystal display device of claim 2, wherein the two short sides have a first short side and a second short side parallel to the first short side, and the two long sides connects the first short side and the second short side, and a length of the first short side is 0.15 to 0.3 times a width of the pixel electrode.

4. The liquid crystal display device of claim 3, wherein the second short side has a length 0.7 to 0.8 times the width of the pixel electrode.

5. The liquid crystal display device of claim 4, wherein the trapezoidal shape has an obtuse angle in a range of 91° to 130°.

6. The liquid crystal display device of claim 1, the plurality of liquid crystal molecules is disposed over the common electrode.

7. The liquid crystal display device of claim 6, further comprising a second substrate over the liquid crystal molecules.

8. The liquid crystal display device of claim 7, further comprising a first alignment layer disposed between the common electrode and the liquid crystal molecules, and a second alignment layer disposed between the second substrate and the liquid crystal molecules.

9. The liquid crystal display device of claim 8, wherein the plurality of liquid crystal molecules are positive liquid crystal molecules having positive dielectric anisotropy, and the first alignment layer and the second alignment layer have an alignment direction parallel to the plurality of data lines.

10. The liquid crystal display device of claim 8, wherein the plurality of liquid crystal molecules are negative liquid crystal molecules having negative dielectric anisotropy, and the first alignment layer and the second alignment layer have an alignment direction parallel to the plurality of gate lines.

11. The liquid crystal display device of claim 1, wherein the single closed opening of the common electrode has a polygonal shape which has bilateral symmetry.

12. The liquid crystal display device of claim 1, wherein each of the two long sides has a bent portion.

13. The liquid crystal display device of claim 12, wherein each of the two long sides has two sides parallel to first and second directions, respectively, and the first and second directions cross the plurality of data lines and cross each other.

* * * * *